United States Patent [19]

Reyneri

[11] Patent Number: 4,813,041

[45] Date of Patent: Mar. 14, 1989

[54] VERY LOW POWER ANALOG MULTIPLEXERS

[75] Inventor: Leonardo M. Reyneri, Noordwijk, Netherlands

[73] Assignee: Agence Spatiale Europeenne, Paris Cedex, France

[21] Appl. No.: 101,404

[22] Filed: Sep. 28, 1987

[30] Foreign Application Priority Data

Oct. 9, 1986 [FR] France .................. 86 14053

[51] Int. Cl.$^4$ .............................. H04J 3/04
[52] U.S. Cl. .................. 370/112; 328/105; 307/244; 370/113
[58] Field of Search .............. 370/112, 113; 328/105, 328/104; 307/244, 243

[56] References Cited

U.S. PATENT DOCUMENTS 3,614,327 10/1971 Easton ................................. 370/112
4,390,988 6/1983 Best ..................................... 320/113
4,551,634 11/1985 Takahashi et al. ................. 370/112

Primary Examiner—Robert L. Griffin
Assistant Examiner—Frank M. Scutch, III
Attorney, Agent, or Firm—Cushman, Darby & Cushman

[57] ABSTRACT

An analog multiplexer with N variables (or control signals) is provided, the configuration of which is defined by a number of controlled switches in series per channel and per input parameter (or per input) which is equal to K, K being defined by the ratio N/2 or the ratio (N−1)/2 depending on whether N is even or uneven, respectively, and a number of input parameters (or inputs) equal to the number of combinations $$\binom{N}{K}.$$

The N control signals are appropriately assigned to the different switches of each input.

2 Claims, 3 Drawing Sheets

FIG_1

(PRIOR ART)

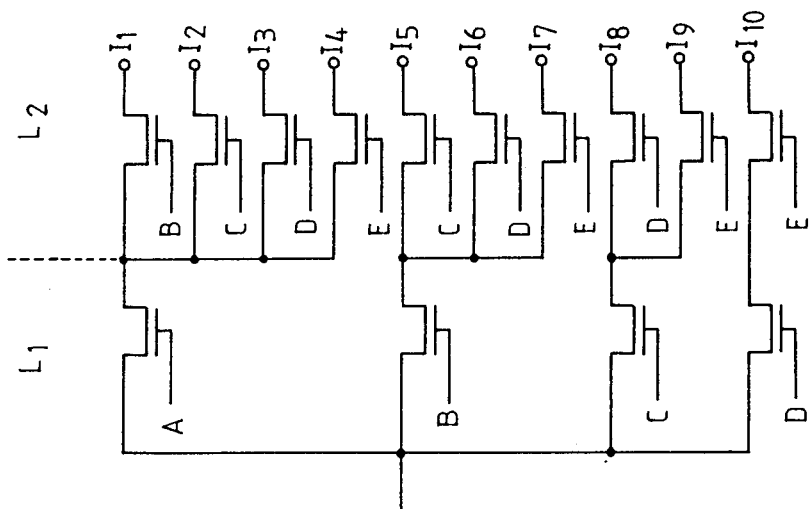
FIG._3
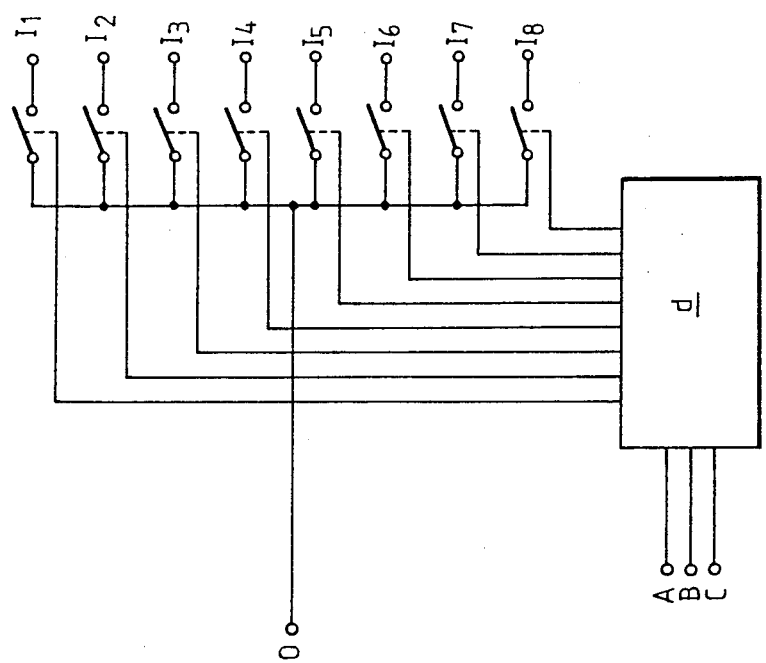
FIG. 2
(PRIOR ART)

VERY LOW POWER ANALOG MULTIPLEXERS

BACKGROUND OF THE INVENTION

Field of the Invention

The present invention relates to a new category of analog multiplexers which are intended more particularly but not limitatively to be used for data acquisition during scientific observations made from space vessels.

More precisely, it deals with multiplexers which have been developed for a space program of the EUROPEAN SPACE AGENCY using infrared space observatories, called ISO program.

These observatories are cryogenic space vessels, resulting from space technology, which are equipped with image sensors formed by infrared (IR) sensitive cameras cooperating with an infrared telescope so as to make possible the scientific observation of the space environment. The use of ISO cryogenic vessels for this type of space observation is essential so as to reduce to a minimum the thermal noise of the sensors.

To achieve this, a reservoir filled with a coolant such as liquid helium (LHE) or liquid nitrogen ($LN_2$) is installed in an ISO vessel, which allows the desired low temperature level to be obtained inside the vessel.

It is obvious that the lifetime of the coolant (and so the duration of the space mission) is inversely proportional to the thermal losses in the vessel, the major part of which is due to the thermal conductivity of the electric wires used for the connection of the sensors and actuators, disposed inside the cryogenic vessel, to the electronic monitoring devices placed outside the vessel.

It is known that the use of an analog multiplexer inside a cryogenic vessel greatly reduces the number of electric wires which pass through the interface separating the warm environment, existing outside the vessel, from the cold environment existing thereinside, (hereafter mention will be made more simply of warm/cold or cold/warm interface).

It has been calculated that the reduction of the number of wires thus obtained results in a reduction of the thermal losses such that the duration of an ISO program is increased by more than two months.

However, even a multiplexer dissipates electric power and generates heat, which affects the duration of a space mission so that, for the use of a multiplexer to form a real advantage, its power dissipation must be much lower than the reduction in thermal input due to the reduction of the number of wires providing the electric connections.

In order to justify the use of a multiplexer, it must have the following properties:

very low electric power consumption and more particularly less than 5 $\mu$W/channel, a very small number of control lines, and the ability to operate in a temperature range between 4.2K (liquid helium temperature) and 77K (liquid nitrogen temperature).

Now, the constraints of the environment suggest using GaAs MESFETs (namely the technology using gallium arsenide, GaAs, as substrate instead of silicon in a junction FET variant called Schottky FET or MESFET).

In fact, on the one hand, CMOS cannot be used unless an improvement is made to the corresponding technology and, on the other hand, no bipolar technology seems to be able to withstand the stresses due to the low temperature involved in the use of liquid helium.

Insofar as the known types of multiplexers are concerned, FIGS. 1 and 2 accompany the present description show two configurations which are currently used in most applications.

FIG. 1 shows a binary tree multiplexer with 11 inputs and one output.

Among the 11 inputs there are eight input parameters $I_1$ to $I_8$ and three variables (or control signals) A, B, C. The output is designated by the letter O.

The switches are controlled switches, for example FET switches (using field effect transistors).

Generally, the standard configurations include N variables (or control signals) and $2^N$ parameters $I_1$ to $I_{2^N}$. Since for each control signal A, B, C there also exists its complement (or its inverse or negation) $\overline{A}$, $\overline{B}$, and $\overline{C}$ respectively—which are generally obtained by means of N inverters i (or NOT operators, also called NOT gates)—we then generally have 2N control lines.

Under these conditions it is obvious that, if the warm-/cold interface is formed by the barrier designated schematically by the dot dash line $\alpha$, all the N inverters are disposed inside the cryogenic vessel and N lines are routed through this interface, whereas, if on the contrary, the warm/cold interfaces is formed by the barrier designated schematically by the line $\beta$, all the N inverters are disposed outside the cryogenic vessel and the number of lines which pass through the interface is equal to 2N.

Now, having dismissed the bipolar and CMOS technologies, for the reasons mentioned above, in favor of GaAs MESFET technology, it is obvious that, the interface represented by the line $\alpha$ should not be adopted in this case, that is, that the N inverters must not be disposed inside the cryogenic vessel, because GaAs inverters require a lot of supply power, well above 1 mW/gate.

Furthermore, it should also be taken into account that electric power is also dissipated in the ON (load) resistance of the enabled channel: since each channel has N switches in series (and so three in the case shown in FIG. 1), the total load resistance in three times higher than the ON (load) resistance of a single switch.

FIG. 2, a single switch array, shows an arrangement of individual switches controlled by a decoder d. The number of control signals and thus of control lines is N for 2N input parameters.

Since the power dissipated by the decoder is also relatively high in this case, the configuration shown in FIG. 2 cannot be adopted either, unless a very low ON (load) resistance is required while driving relatively high current loads.

SUMMARY OF THE INVENTION

The purpose of the present invention is to provide a new category of analog multiplexers which satisfy the requirements of practice better than the multiplexers known heretofore, more particularly in that:

they have a small number of lines and so of control signals, they require no logic, they require no power supply, and they have a lower ON (load) resistance.

The present invention provides an analog multiplexer with N variables (or control signals), characterized in that its configuration (or structure) is defined by:

a number of controlled switches in series per channel, namely per input parameter (or input) which is equal to K, K being defined by the ratio N/2 or the ratio (N−1)/2 depending on whether N is even or uneven, respectively.

a number of input parameters (or inputs) equal to the number of combinations $$\binom{N}{K},$$

the N control signals being assigned to the different switches of each input of the following way:

(a) the first K control signals among the N available are assigned in the same order to the K switches of the first input, the order in which the switches follow each other in each channel being defined by the direction which goes from the common output of the multiplexer to the corresponding input.

(b) the other N−K control signals are assigned in the same order to the other inputs, namely from the second input up to the (N−K+1)th input, each including a switch in series with the first K−1 switches of the first input, (c) the first K−2 switches of the first input are then placed in series with the last two switches of the (N−K+2)th input, to which are assigned respectively the Kth and the (K+1)th control signals, in said direction, the inputs following said (N−K+2)th input up to the (2N−2K+1)th input each including a switch in series with said K-2 switches of the first input and the last but one switch of said (N−K+2)th input, the control signals from the (K+2)th up to the Nth being assigned to the switches of said inputs following this (N−K+2)th input, (d) as described under (a), the first K−2 switches of the first input are disposed in series with the last two switches of the 2.(N−K+1)th input which follows said (2N−2K+1)th input, to which are assigned respectively the (K+1)th and (K+2)th control signals, in said direction, the inputs following said 2.(N−K+1)th input up to the (3N−3K+2)th input each including a switch in series with said K−2 switches of the first input and the last but one switch of said 2.(N−K+1)th, the control signals from the (K+3)th to the Nth being assigned to the switches of said inputs following this 2.(N−K+1)th input, (e) the assignments are repeated as described under (c) and (d) from the 3.(N−K+1)th input up to the (4N−4K+1)th input and so on until the input is reached having as last two switches in series with said first K−2 switches of the first input those to which the (N−1)th and Nth control signals, respectively, are assigned, (f) after which, the first K−3 switches of the first input are placed in series with the last three switches of the input following the input which is reached by applying the assignments described under (e), to which three switches are assigned the (K−1)th, Kth and (K+1)th controlled signals, in said directions, the same assignments as indicated indicated under (c) being applied to the successive inputs, and so on, until the input is reached having at last three switches in series with said first K−3 switches of the first input those to which the (N−2)th, (N−1)th and Nth control signals, respectively, are assigned, (g) all the assignments described under (a) up to those described under (f) are repeated, from the input following the input which is reached by applying the assignments described under f), taking into account that this time K control signals from the N available which go from the second to the (K+1)th are assigned to the K switches of the new starting input (which is then in a position similar to that of the first input), and so on, until the final input is reached, which is the $$\binom{N}{K}\text{th},$$

to the K switiches of which are assigned the last K control signals from the N available signals.

Besides the above arrangements, the invention further includes other arrangements which will be clear from the following description.

BRIEF DESCRIPTION OF THE DRAWINGS

The invention will be better understood from the complement of description which follows, in reference to the accompanying drawings in which:

FIGS. 1 and 2 illustrate the configuration of two types of multiplexer used in the prior art and described above (referred to, respectively, as binary tree and single switch array), FIG. 3 shows a multiplexer with five variables, or control signals, the configuration of which is of the type in accordance with the invention.

It should however be understood that these drawings and the corresponding descriptive parts are given solely by way of illustration of the invention, of which they in no way form a limitation.

DESCRIPTION OF THE PREFERRED EMBODIMENT

Referring to FIG. 3, a multiplexer is illustrated having N=5 variables (or control signals) A, B, C, D, E the assignment of which to switches is in accordance with the invention.

It is easy to show that for each input parameter (or input) we have K32 (N−1)/2=(5−1)/2=2 switches, and that the number of inputs is equal to:

$$\binom{N}{K} = \binom{5}{2} = \frac{5 \cdot 4}{2} = 10.$$

Furthermore, the N=5 control signals are assigned to the K=2 switches of each input as shown in FIG. 3, the corresponding control signal being shown for each switch, taking into account the general assignment rules set forth under (a) up to those set forth under (g) and described above within the definition of the invention.

It goes without saying that since the switches are to be controlled by the same control signals, they are connected together.

Figure 4:
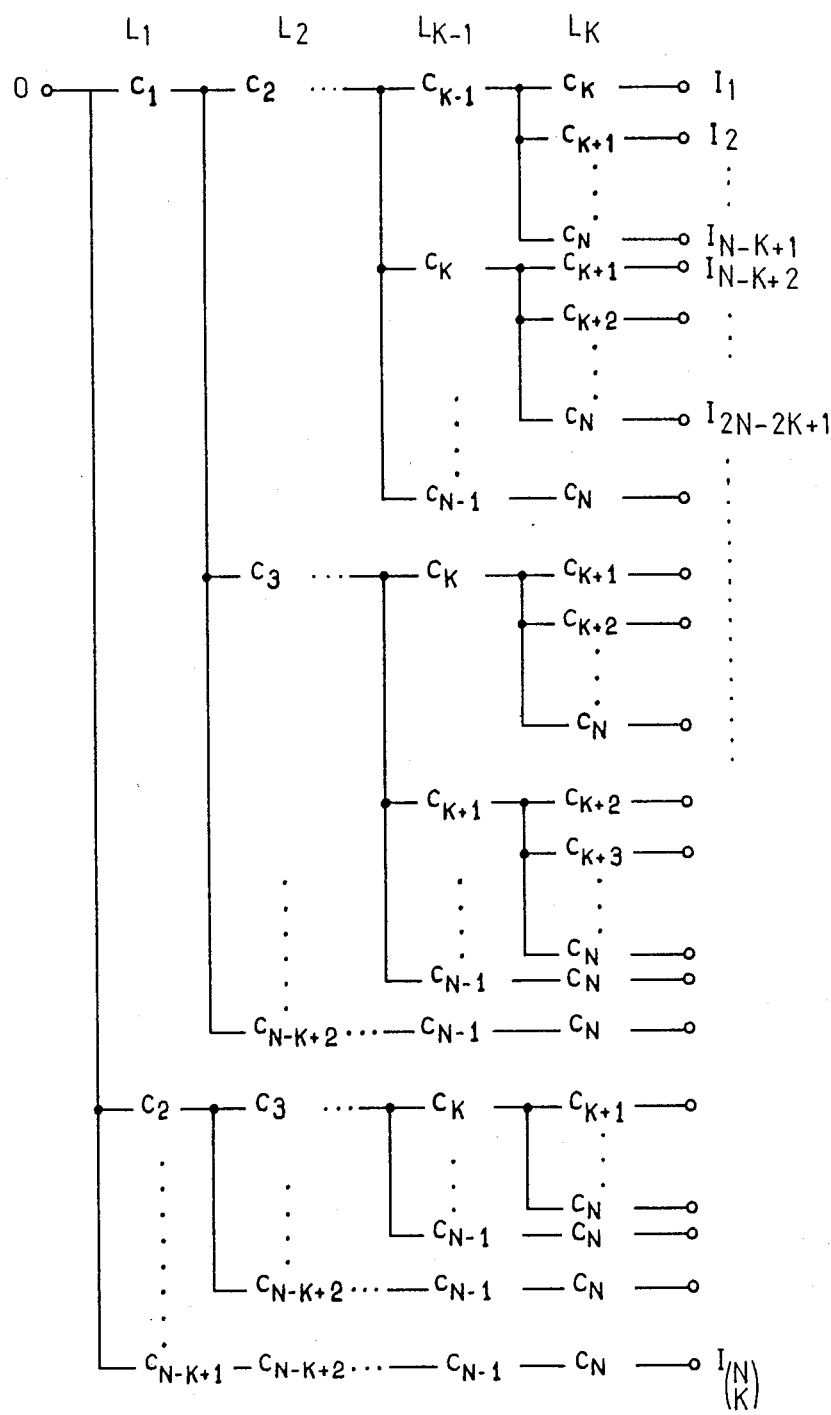
FIG. 4 illustrates the general configuration of a multiplexer with N variables, or control signals, in accordance with the invention.

FIG. 4 illustrates the assignments in accordance with the above mentioned rules in the general case of a multiplexer with N variables, the letters C representing the switches schematically.

In each case it can be seen that the switches are distributed in vertical rows which correspond to the layers $L_1 \ldots L_K$ of the multiplexer.

The general configuration or structure of a multiplexer of the invention may be defined as exhaustive undecoded matrix (EUM) and may be single or multiple (and in particular double).

Figure 1:
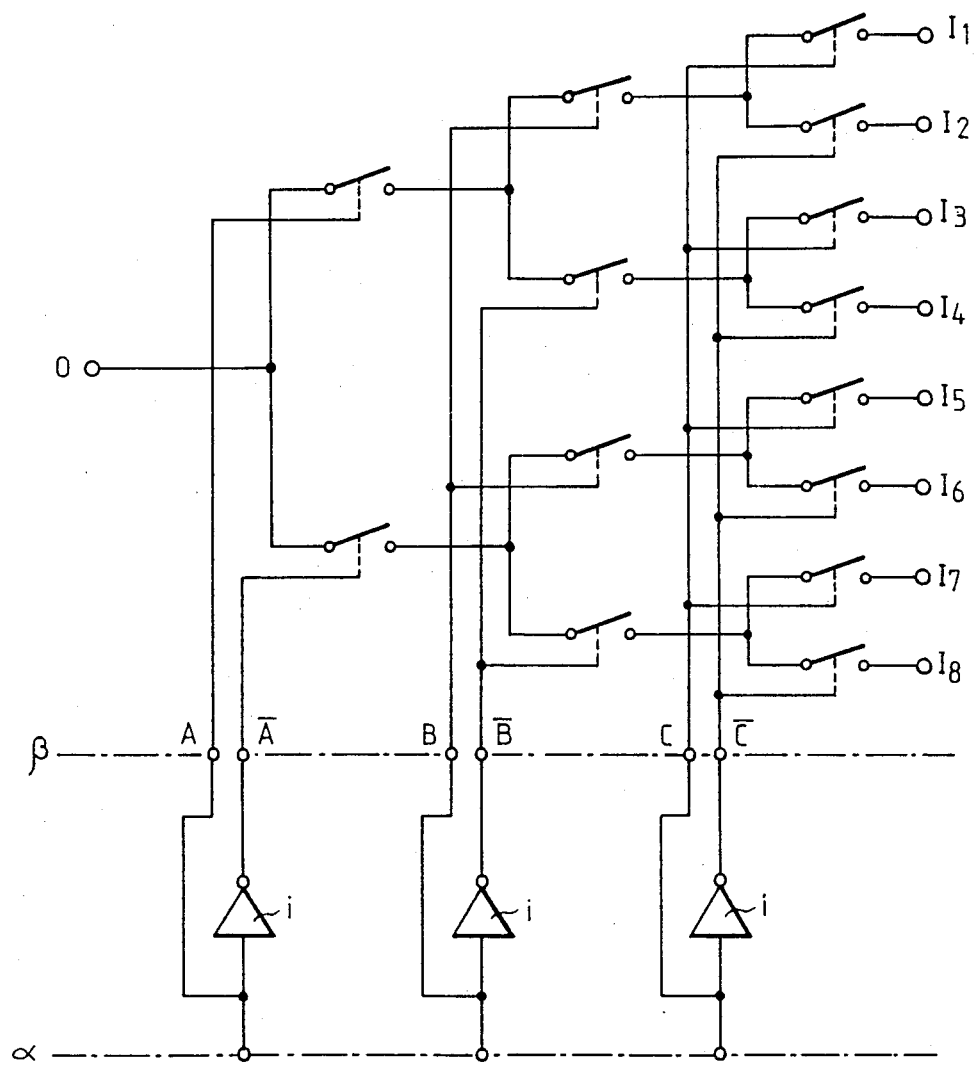

The following table compares the prior art multiplexers, in particular those shown in FIGS. 1 and 2, with the single and double EUM multiplexers of the invention.

Insofar as the equivalence between the prior art multiplexers and those of the present invention is concerned, it should be recalled that the purpose of a multiplexer is to connect one output to one of a set of inputs chosen as a function of the state of the control lines and of selection criteria, a priori arbitrary.

This being so, it is easy to check that the prior art multiplexers and those of the present invention satisfy the above conditions and that they are therefore equivalent from the functional point of view.

TABLE 1

COMPARISON BETWEEN THE PRIOR ART MULTIPLEXERS AND THE MULTIPLEXERS OF THE INVENTION

| N° Conf. | Configuration | No of inputs | Control lines | Control gate | $C_g$ | No of switches per I/P | $C_{t1}$ | $R_{on}$ | $I_{off}$ | $C_{cc}$ |
|---|---|---|---|---|---|---|---|---|---|---|
| | | | Prior Act Multiplexers as shown in FIG. 1 | | | | | | | |
| 1 | Mult. FIG. 1 | 4 | 2(4) | 2 | 1-2 | 1.5 | 1(2) | 2 | 2 | 4 |
| 2 | Mult. FIG. 1 | 8 | 3(6) | 3 | 1-4 | 1.75 | 1(2) | 3 | 3 | 6 |
| 3 | Mult. FIG. 1 | 16 | 4(8) | 4 | 1-8 | 1.88 | 1(2) | 4 | 4 | 8 |
| 4 | Mult. FIG. 1 | 32 | 5(10) | 5 | 1-16 | 1.94 | 1(2) | 5 | 5 | 10 |
| 5 | Mult. FIG. 1 | 64 | 6(12) | 6 | 1-32 | 1.97 | 1(2) | 6 | 6 | 12 |
| 6 | Mult. FIG. 1 | 128 | 7(14) | 7 | 1-64 | 1.98 | 1(2) | 7 | 7 | 14 |
| 7 | Mult. FIG. 1 | 256 | 8(16) | 8 | 1-128 | 1.99 | 1(2) | 8 | 8 | 16 |
| | | | Single EUM multiplexers of the invention | | | | | | | |
| 8 | EUM - single | 6 | 4 | 0 | 1-3 | 1.5 | 2 | 2 | 3.3 | 6 |
| 9 | EUM - single | 10 | 5 | 0 | 1-4 | 1.4 | 2 | 2 | 5 | 8 |
| 10 | EUM - single | 20 | 6 | 0 | 1-10 | 1.7 | 2 | 3 | 11 | 12 |
| 11 | EUM - single | 35 | 7 | 0 | 1-15 | 1.57 | 2 | 3 | 9 | 15 |
| | | | Double EUM multiplexers of the invention | | | | | | | |
| 12 | Double 6 × 6 | 36 | 8 | 0 | 1-3 | 1.75 | 2 | 4 | 4 | 12 |
| 13 | Double 6 × 10 | 60 | 9 | 0 | 1-4 | 1.55 | 2 | 4 | 4 | 14 |
| 14 | Double 10 × 10 | 100 | 10 | 0 | 1-4 | 1.54 | 2 | 4 | 6 | 16 |
| 15 | Double 6 × 20 | 120 | 10 | 0 | 1-10 | 1.78 | 2 | 5 | 4 | 18 |
| 16 | Double 10 × 20 | 200 | 11 | 0 | 1-10 | 1.77 | 2 | 5 | 6 | 20 |
| 17 | Double 6 × 35 | 210 | 11 | 0 | 1-15 | 1.62 | 2 | 5 | 4 | 21 |
| 18 | Double 10 × 35 | 350 | 12 | 0 | 1-15 | 1.61 | 2 | 5 | 6 | 21 |
| | | | Prior multiplexers as shown in FIG. 2 | | | | | | | |
| 19 | Single | 4 | 2 | 6 | 1 | 1 | 1 | 1 | 4 | 4 |
| 20 | Single | 8 | 3 | 11 | 1 | 1 | 1 | 1 | 8 | 8 |
| 21 | Single | 16 | 4 | 20 | 1 | 1 | 1 | 1 | 16 | 16 |
| 23 | Single | 32 | 5 | 37 | 1 | 1 | 1 | 1 | 32 | 32 |
| 24 | Single | 64 | 6 | 70 | 1 | 1 | 1 | 1 | 64 | 64 |
| 25 | Single | 128 | 7 | 135 | 1 | 1 | 1 | 1 | 128 | 128 |

It should be noted that the figures shown in Table 1 have been calculated but not measured.

In so far as the values shown for the load resistance $R_{on}$ are concerned, they are relative to the ON (load) resistance of each switch.

Furthermore, apart from the columns the interpretation of which poses no problem, the table also includes columns designated by:

$C_g$, which represents the (minimum and maximum) number of control electrodes (gates) connected to the same control line and is equal (in relative units) to the capacitive load (minimum and maximum respectively) of each control line, $I_{off}$, which represents the leakage current at the output of the multiplexer estimated relatively to the leakage current of a single transistor, $C_{cc}$, which represents the common mode capacitance of each active channel (with respect to mass), estimated relatively to the channel capacitance of a single transistor.

In addition, as is well known to technicians in the art, the dynamic power required by the control lines is usually calculated by subjecting them to cyclic scanning and, under these conditions, the level of the control lines varies periodically: $C_{ti}$ represents the total number of level transitions on the control lines per each scanning cycle thereof, divided by the number of inputs.

This is illustrated, by way of example, by the following tables 2 and 3 which refer to the multiplexers of FIGS. 1 and 3, respectively, for which the selection criteria are slightly different, without that resulting in a functional difference.

Of course, L and H in tables 2 and 3 represent the low and high levels, respectively, defining together the state of the control lines. With each state of these latter is associated one input I of the corresponding multiplexer, determined in accordance with the selection criteria illustrated in the tables 2 and 3 below.

TABLE 2

| Multiplexer of FIG. 1 | | | |
|---|---|---|---|
| A | B | C | I |
| L | L | L | 1 |
| H | L | L | 2 |
| L | H | L | 3 |
| H | H | L | 4 |
| L | L | H | 5 |
| H | L | H | 6 |
| L | H | H | 7 |
| H | H | H | 8 |

TABLE 3

| Multiplexer of FIG. 3 | | | | | |
|---|---|---|---|---|---|
| A | B | C | D | E | I |
| H | H | L | L | L | 1 |
| H | L | H | L | L | 2 |
| H | L | L | H | L | 3 |
| H | L | L | L | H | 4 |
| L | H | H | L | L | 5 |
| L | H | L | H | L | 6 |
| L | H | L | L | H | 7 |
| L | L | H | H | L | 8 |
| L | L | H | L | H | 9 |
| L | L | L | H | H | 10 |

A prototype of the invention is being developed as a single integrated circuit using, as already mentioned, the GaAs MESFET technology.

The multiplexer shown by this prototype is a multiplexer with five variables, and so with two switches in series per channel and with $$\binom{5}{2} = 10$$

inputs.

More precisely, the prototype includes the integration of the same chip of two identical multiplexers but with independent inputs and outputs, while sharing the same signals and so the same control lines. In this case, the breakdown of the total number of pins is the following:

5 control lines
2 outputs
20 inputs (10×2)
1 ground (for the reference voltage, substrate)
=28 pins.

After the necessary quality tests, the integrated circuit corresponding to the above prototype will be used on a cryogenic vessel for an ISO mission.

As is clear from the preceding, the invention is in no way limited to those of its embodiments and modes of application which have been described more explicitly; it embraces, on the contrary, all variants thereof which may occur to a technician skilled in the art, without departing from the scope or spirit of the present invention.

What is claimed is:

1. An analog multiplexer with N variables having a configuration defined by:
    a number of controlled switches in series per channel, namely per input parameter which is equal to K, K being defined by the ratio N/2 or the ratio (N−1)/2 depending on whether N is even or uneven, respectively, and
    a number of input parameters equal to the number of combinations.

$$\binom{N}{K}.$$

2. The multiplexer as claimed in claim 1, wherein the N control signals are assigned to the different switches of each input in the following way:
    (a) the first K control signals among the N available are assigned in the same order to the K switches of the first input ($I_1$), the order in which the switches follow each other in each channel being defined by the direction which goes from the common output (O) of the multiplexer to the corresponding input,
    (b) the other N−K control signals are assigned in the same order to the other inputs, namely from the second input ($I_2$) up to the (N−K +1)th input, each including a switch in series with the first K−1 switches of the first input,
    (c) the first K−2 switches of the first input are then placed in series with the last two switches of the (N−K+2)th input, to which are assigned respectively the Kth and the (K+1)th control signals, in said direction, the inputs following said (N−K+2)th input up to the (2N−2K+1)th input each including a switch in series with said K−2 switches of the first input and the last but one switch of said (N−K+2)th input, the control signals from the (K+2)th up the Nth being assigned to the switches of said inputs following this (N−K+2)th input,
    (d) as described under (a), the first K−2 switches of the first input are disposed in series with the last two switches of the (2) (N−K+1)th input which follows said (2N−2K+1)th input, to which are assigned respectively the (K+1)th and (K+2)th control signals, in said direction, the inputs following said (2) (N−K+1)th input up to the (3N−3K+2)th input each including a switch in series with said K−2 switches of the first input and the last but one switch of said (2) (N−K+1)th, the control signals from the (K+3)th to the Nth being assigned to the switches of said inputs following this (2) (N−K+1)th input,
    (e) the assignments are repeated as described under c) and d) from the (3) (N−K+1)th input up to the (4N−4K+1)th input, and so on, until the input is reached having as last two switches, in series with said first K−2 switches of the first input, those to which the (N−1)th and Nth control signals, respectively, are assigned,
    (f) after which, the first K−3 switches of the first input are placed in series with the last three switches of the input following the input which is reached by applying the assignments described under (e), to which three switches are assigned the (K−1)th, Kth and (K+1)th controlled signals, in said direction, the same assignments as indicated under (c) being applied to the successive inputs, and so on, until the input is reached having as last three switches in series with said first K−3 switches of the first input those to which the (N−2)th, (N−1)th and Nth control signals, respectively, are assigned,
    (g) all the assignments described under (a) up to those described under (f) are repeated, from the input following the input which is reached by applying the assignments described under (f), taking into account that this time K control signals from the N available which go from the second to the (K+1)th are assigned to the K switches of the new starting input (which is then in a position similar to that of the first input), and so on, until the final input is reached, which is the $$\binom{N}{K}\text{th},$$

to the K switches of which are assigned the last K control signals from the N available signals.

* * * * *